US006927092B2

(12) United States Patent
Lee et al.

(10) Patent No.: US 6,927,092 B2
(45) Date of Patent: Aug. 9, 2005

(54) METHOD OF FORMING A SHARED GLOBAL WORD LINE MRAM STRUCTURE

(75) Inventors: Heon Lee, Sunnyvale, CA (US); Fred Perner, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/656,758

(22) Filed: Sep. 5, 2003

(65) Prior Publication Data

US 2004/0047213 A1 Mar. 11, 2004

Related U.S. Application Data

(62) Division of application No. 10/079,311, filed on Feb. 20, 2002, now Pat. No. 6,665,205.

(51) Int. Cl.[7] .................................................. H01L 21/00
(52) U.S. Cl. .......................................... 438/73; 365/171
(58) Field of Search .............................. 438/3, 73, 691, 438/595, 596, 625–629, 642–645, 631, 648, 652–654, 672, 687; 257/295, 296, 421, 661; 365/66, 158, 171, 173

(56) References Cited

U.S. PATENT DOCUMENTS 6,413,788 B1 * 7/2002 Tuttle ............................ 438/3
6,548,849 B1 * 4/2003 Pan et al. ................... 257/296

* cited by examiner

*Primary Examiner*—David Vu
(74) *Attorney, Agent, or Firm*—Brian R. Short

(57) ABSTRACT

A method of forming a shared global word line MRAM structure is disclosed. The method includes, etching a trench in an oxide layer formed over a substrate, depositing an first liner material, anisotropically etching the deposited first liner material leaving the first liner material on edges of the trench and physically contacting a bottom of the trench, depositing an magnetic metal liner material, anisotropically etching the deposited magnetic metal liner material leaving the magnetic metal liner material over the first liner material on edges of the trench, so that the magnetic metal liner extends to and physically contacts the bottom of the trench, depositing a conductive layer;, and chemically, mechanically polishing the conductive layer.

7 Claims, 8 Drawing Sheets

METHOD OF FORMING A SHARED GLOBAL WORD LINE MRAM STRUCTURE

This application is a div of Ser. No. 10/079,311 Feb. 20, 2002 U.S. Pat. No. 6,665,205.

FIELD OF THE INVENTION

The invention relates generally to magnetic random access memory (MRAM). More particularly, the invention relates to MRAM having a shared global word line.

BACKGROUND OF THE INVENTION

MRAM devices generally include an array of memory cells. The memory cells are typically configured in rows and columns. Each row generally includes a corresponding word line, and each column generally includes a corresponding bit line. FIG. 1 shows an MRAM array of memory cells 110, 120, 130, 140, and corresponding word lines (WL) and bit lines (BL). The MRAM memory cells 110, 120, 130, 140 are located at cross-points of the word lines and the bit lines, and each MRAM memory cells 110, 120, 130, 140 stores a bit of information though an orientation of magnetization within the memory cells.

FIG. 2 shows an MRAM memory cell 205 in greater detail. The MRAM memory cell 205 generally includes a soft magnetic region 210, a dielectric region 220 and a hard magnetic region 230. The orientation of magnetization within the soft magnetic region 210 is non-fixed, and can assume two stable orientations as shown by the arrow M1. The hard magnetic region 230 (also referred to as a pinned magnetic region) has a fixed magnetic orientation as depicted by the arrow M2. The dielectric region 220 generally provides electrical insulation between the soft magnetic region 210 and the hard magnetic region 230.

As previously stated, the orientation of magnetization of the soft magnetic region 210 can assume two stable orientations. These two orientations which are either parallel or anti-parallel to the magnetic orientation of the hard magnetic region 230, determine the logical state of the MRAM memory cell 205.

The orientation of magnetization of the soft magnetic region 210 is determined in response to electrical currents applied to the bit lines (BL) and the word lines (WL) during a write operation to the MRAM memory cell. The electrical currents applied to the bit lines and the word lines set the orientation of the magnetization depending upon the direction of the currents flowing through the bit lines and the word lines, and therefore, the directions of the induced magnetic fields created by the currents flowing through the bit lines and the word lines.

FIG. 2A shows the orientations of the magnetization of an MRAM memory cell in greater detail. A first MRAM memory cell orientation 240 includes the magnetic orientations of both the soft magnetic region and the hard magnetic region being in the same direction. A second MRAM memory cell orientation 250 includes the magnetic orientation of the soft magnetic region and the hard magnetic region being in opposite directions. A property of MRAM memory cells is that a resistance across the MRAM memory cell is low if the magnetic orientations are the same in the two regions as for the first MRAM memory cell orientation 240. However, the resistance across the MRAM memory cell is high if the magnetic orientations are the opposite in the two regions as for the second MRAM memory cell orientation 250.

The magnetic orientations of the MRAM memory cells are set (written to) by controlling electrical currents flowing through the word lines and the bit lines, and therefore, the corresponding magnetic fields induced by the electrical currents. Because the word line and the bit line operate in combination to switch the orientation of magnetization of the selected memory cell (that is, to write to the memory cell), the word line and the bit line can be collectively referred to as write lines. Additionally, the write lines can also be used to read the logic value stored in the memory cells.

The MRAM memory cells are read by sensing a resistance across the MRAM memory cells. The resistance sensing is accomplished through the word lines and the bit lines.

Generally, a voltage potential of the word lines and bit lines is limited because the word lines and bit lines are physically connected to the MRAM memory cells. That is, a voltage potential across the MRAM memory cells of a great enough value will destroy the MRAM memory cells. Therefore, the voltage potential (and resulting current) across the word lines and bit lines must be limited to a value that does not destroy the MRAM memory cells. This limits the current flowing (and the intensity of the resulting magnetic fields) through the word lines and bit lines.

Connecting a large number of MRAM memory cells to the same word lines and bit lines can reduces the effectiveness of sensing the resistive state of a single MRAM memory cell. The MRAM memory cells are connected in parallel. Therefore, the resulting output resistance sensed between the word lines and bit lines can become small. This makes detection of the resistance of any particular MRAM memory cell more difficult.

The magnitudes of the write currents through the word lines and bit lines of prior art MRAM memory cell arrays are limited by the resistance of the word lines and the bit lines. As integrated circuits and associated MRAM memory cell array become smaller, the physical dimensions of the associated word lines and bit lines become smaller. However, the smaller the physical dimensions of the word lines and the bit lines, the greater the resistance of the word lines and the bit lines. Therefore, as the dimension of the word lines and the bit lines is reduced, the magnitudes of the write currents that can be applied to the word lines and the bit lines are reduced. The net result that the magnitude of the magnetic fields generated by the word lines and the bit lines becomes more limited as the physical size of the MRAM memory cell arrays becomes smaller.

It is desirable to have an apparatus and method that provides writing to, and reading from, MRAM memory cells. It is desirable that a voltage potential applied to word lines that set magnetization direction with the MRAM memory cell not be limited. Additionally, it is desirable to shorten word or bit lines used to sense the resistance across the MRAM memory cell. It is also desirable to minimize the processing steps required to fabricate the MRAM memory cell arrays.

SUMMARY OF THE INVENTION

The invention includes an apparatus and a method for writing to MRAM memory cells through the use a shared global word line. Voltage potentials applied to the shared global word line are not limited by characteristics of the MRAM memory cells. The apparatus and method provides for shortened sense lines, which improves the sensing of a resistive state of the MRAM memory cells. A shared global word line structure according to the invention add a minimal number of processing steps to the fabrication of MRAM memory arrays.

A first embodiment of the invention includes a shared global word line MRAM structure. The MRAM structure includes a first bit line conductor oriented in a first direction. A first sense line conductor is oriented in a second direction. A first memory cell is physically connected between the first bit line conductor and the first sense line conductor. A global word line is oriented in substantially the second direction, and magnetically coupled to the first memory cell. A second bit line conductor is oriented in substantially the first direction. A second sense line conductor is oriented in substantially the second direction. A second memory cell is physically connected between the second bit line conductor and the second sense line conductor. The global word line is also magnetically coupled to the second memory cell.

The first memory cell and the second memory cell can be MRAM devices. A logical state of the MRAM devices can be determined by an orientation of magnetization of the MRAM devices. The orientation of magnetization of the first memory cell can be determined by current conducted by the first bit line and the global word line. The orientation of magnetization of the second memory cell can be determined by current conducted by the second bit line and the global word line.

A logical state of the first memory cell can be sensed by the first bit line and the first sense line. The logical state of the first memory cell can be determined by a sensing a resistance between the first bit line and the first sense line. A logical state of the second memory cell can be sensed by the second bit line and the second sense line. The logical state of the second memory cell can be determined by a sensing a resistance between the second bit line and the second sense line.

A second embodiment is similar to the first embodiment. The second embodiment includes the first bit line, the first sense line conductor and the first memory cell being a mirror image about the global word line of the second bit line, the second sense line conductor and the second memory cell.

A third embodiment is similar to the first embodiment. For the third embodiment, the global word line includes a conductive center and magnetic metal liner. The global word line providing a bi-directional magnetic field when conducting current, thereby allowing the global word line to orient magnetic states of both the first memory cell and the second memory cell.

A fourth embodiment includes method of forming a shared global word line MRAM structure. The method includes etching a trench is an oxide layer formed over a substrate. A first liner material is deposited over the trench.

The deposited first liner material is ansotropically etched leaving the first liner material on edges of the trench. A magnetic metal liner material is deposited over the first liner material and the substrate. The deposited magnetic metal liner material is ansotropically etched leaving the magnetic metal liner material over the first liner material on edges of the trench. A conductive layer is deposited over the magnetic liner material and the substrate. The conductive layer is chemically, mechanically polished yielding the shared global word line.

Other aspects and advantages of the present invention will become apparent from the following detailed description, taken in conjunction with the accompanying drawings, illustrating by way of example the principles of the invention.

DETAILED DESCRIPTION

Figure 1:
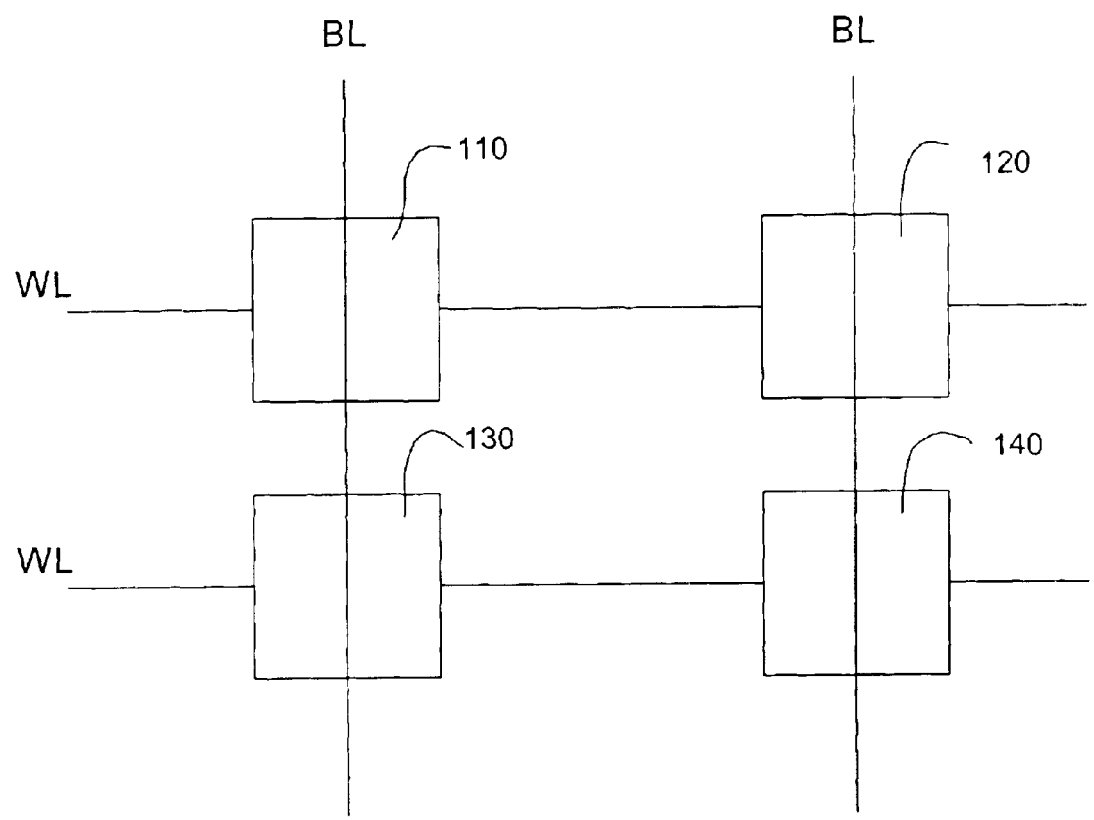
FIG. 1 shows a section of a prior art array of MRAM memory cells.
Figure 2:
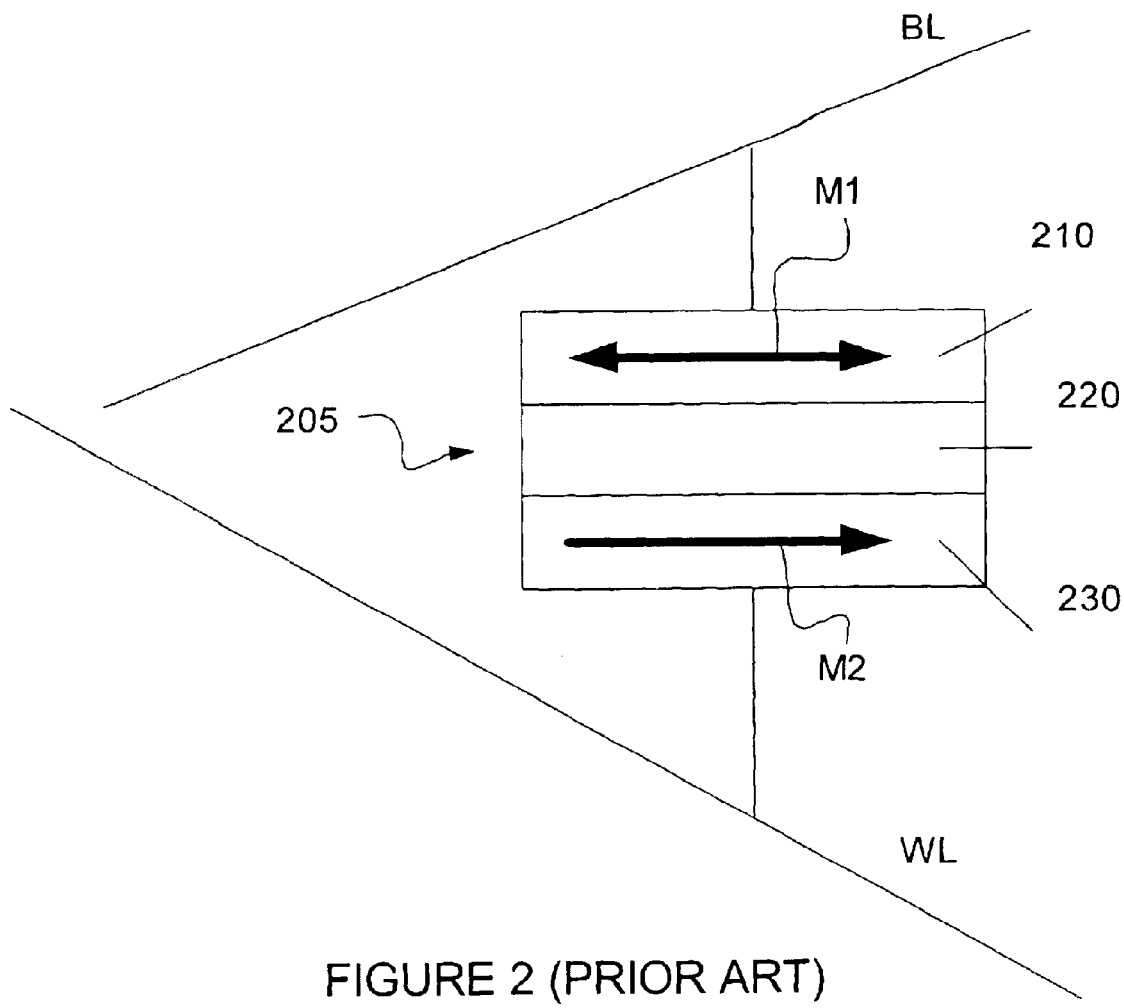
FIG. 2 shows an a prior art MRAM memory cell with greater detail.
Figure 2A:
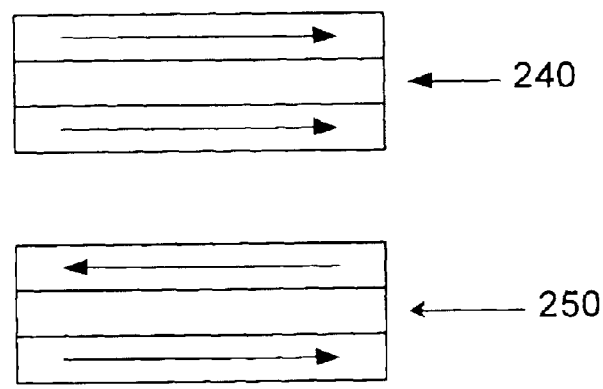
FIG. 2A shows the two magnetic states of an MRAM memory cell.

As shown in the drawings for purposes of illustration, the invention is embodied in an apparatus and a method for writing to MRAM memory cells through the use a shared global word line. Voltage potentials applied to the shared global word line are not limited by characteristics of the MRAM memory cells. The apparatus and method provides for shortened sense lines, which improves the sensing of a resistive state of the MRAM memory cells. A shared global word line structure according to the invention adds a minimal number of processing steps to the fabrication of MRAM memory arrays.

Figure 3:
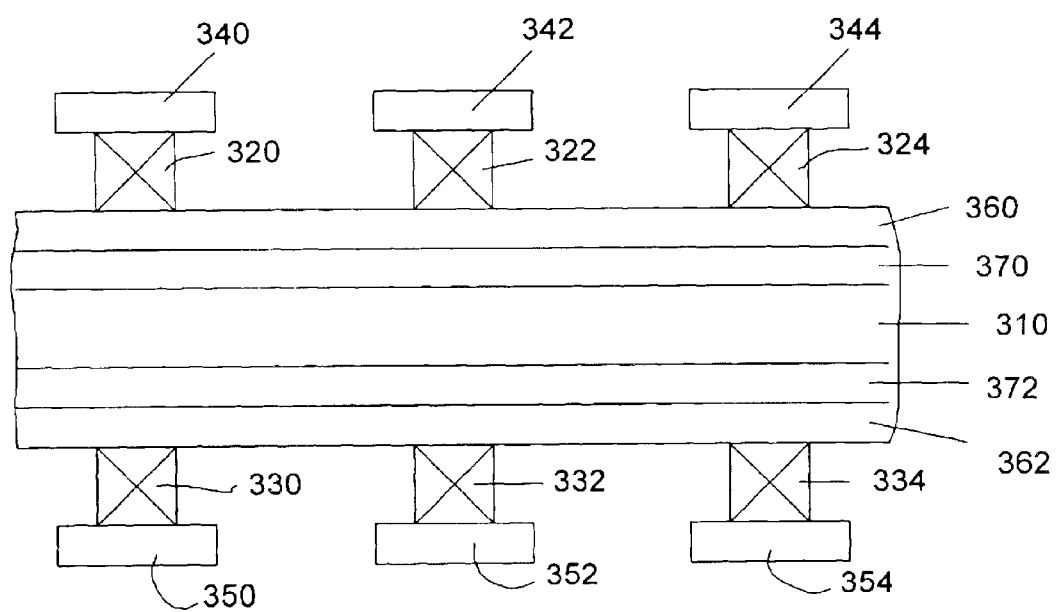
FIG. 3 shows an embodiment of the invention.

FIG. 3 shows an embodiment of the invention. This embodiment includes a stacked MRAM memory element structure in which two separate MRAM memory cell arrays share a common global word line conductor 310. That is, a first MRAM memory cell array includes MRAM memory cells 320, 322, 324 that are magnetically coupled to the common global word line conductor 310, and a second MRAM memory cell array includes MRAM memory cells 330, 332, 334 that are also magnetically coupled to the common global word line conductor 310.

As previously described, the logical states of the MRAM memory cells are set by exposing the magnetic memory cells to a magnetic field that sets the magnetization of the MRAM memory cells to a logical state. For the embodiment of FIG. 3, bit lines 340, 342, 344 and the common global word line conductor 310 set the MRAM memory cells 320, 322, 324 to logical states through magnetic fields induced by currents conducted through the bit lines 340, 342, 344 and the common global word line conductor 310. That is, a logical state is stored in a first MRAM memory cell 320 by magnetic fields induced by a first bit line 340 and the common global word line conductor 310. A logical state is stored in a second MRAM memory cell 322 by magnetic fields induced by a second bit line 342 and the common global word line conductor 310. A logical state is stored in a third MRAM memory cell 324 by magnetic fields induced by a third bit line 344 and the common global word line conductor 310.

For the embodiment of FIG. 3, bit lines 350, 352, 354 and the common global word line conductor 310 set the MRAM memory cells 330, 332, 334 to logical states through magnetic fields induced by currents conducted through the bit lines 350, 352, 354 and the common global word line conductor 310. That is, a logical state is stored in a fourth MRAM memory cell 330 by magnetic fields induced by a fourth bit line 350 and the common global word line conductor 310. A logical state is stored in a fifth MRAM memory cell 332 by magnetic fields induced by a fifth bit line 352 and the common global word line conductor 310. A logical state is stored in a third MRAM memory cell 334 by magnetic fields induced by a sixth bit line 354 and the common global word line conductor 310.

As previously described, the logical states of the MRAM memory cells are determined by sensing a resistance across the MRAM memory cells. A first sense line conductor 360 provides a resistance sensing path for the MRAM memory cells 320, 322, 324. A second sense line conductor 362 provides a resistance sensing path for the MRAM memory cells 330, 332, 334.

A first insulator 370 provides electrical insulation between the global word line 310 and the first sense line conductor 360. A second insulator 372 provide electrical insulation between the global word line 310 and the second sense line conductor 362.

The resistance, and therefore the logical value, of the first MRAM memory cell 320 is determined by sensing the resistance between the first bit line 340 and the first sense line conductor 360. The resistance of the second MRAM memory cell 322 is determined by sensing the resistance between the second bit line 342 and the first sense line conductor 360. The resistance of the third MRAM memory cell 324 is determined by sensing the resistance between the third bit line 344 and the first sense line conductor 360. The resistance of the fourth MRAM memory cell 330 is determined by sensing the resistance between the fourth bit line 350 and the second sense line conductor 362. The resistance of the fifth MRAM memory cell 332 is determined by sensing the resistance between the fifth bit line 352 and the second sense line conductor 362. The resistance of the sixth MRAM memory cell 334 is determined by sensing the resistance between the sixth bit line 354 and the second sense line conductor 362.

Unlike the prior art, the common global word line 310 is physically isolated from the MRAM memory cells. The common global word line 310 is used for writing to the MRAM memory cells, whereas sense lines 360, 362 are used to read from the MRAM memory cells.

Isolation of the common global word line 310 from the MRAM memory cells offers the advantage that the voltage potential of the common global word line 310 is not limited by characteristics of the MRAM memory cells. Therefore, the magnitude of the write current of the common global word line 310, and the resulting magnetic field is not limited by the previously described physical limitations of the MRAM memory cells.

Generally, an advantage of MRAM over other memory technologies (such as, flash, DRAM, MRAM or FeRAM) is that MRAM memory arrays are fabricated with thin film layers similar to and including metal layers over a substrate. Unlike other memory technologies, the substrates covered by the MRAM memory array are available for the integration of sense amplifiers and decoders. Further, the sensitivity of the sense amplifiers is improved as the number of MRAM memory cells connected to a sense line is decreased. Therefore, it is advantageous to configure MRAM memory arrays with the shorted possible sense lines. The minimum length of the sense lines is generally determined by the amount of area required by the sense line decoder and the sense amplifier. This invention allows the separation of the global word line conductor needed for write operations and short sense lines needed for read operations. The shorter sense line of the invention, provide for more accurate sensing of the resistance across the MRAM memory cells. Therefore, the MRAM memory cells can be read more accurately.

The global word line of the invention is physically isolated from the sense lines. Therefore, the write function and the read (sense) functions are separated. The write function typically requires a long, low resistance word line to conduct a write current from a source on one edge of the array to a sink at an opposite edge of the array. A preferable configuration is a very long write word line over many adjacent MRAM arrays that includes a single set of write drivers located at the edges of the chip. The sense lines operate best in a read operation when there are a relatively small number of memory cells connected to the sense lines. Additionally, the sense lines do not have to be low resistance. Therefore, the sense lines can be made thinner and with highly resistive materials. The prior art including combined write/read word line are required to connect to all the memory cells in the array between the write drivers. This requires a higher performance read sense amplifier having a lower signal-to-noise ratio. Additionally, with the word line connected to the memory cells, care must be taken to ensure that voltage potentials applied to the write/read lines that generate write currents do not exceed breakdown voltage potential limits of the memory cells. To ensure proper writing to the MRAM memory cells, the combined word line must have a very low resistance (to limit voltage drops).

The sense lines within an array of MRAM memory cells are each connected to a selected MRAM memory cell and to many other unselected MRAM memory cells. The other ends of the unselected MRAM memory cells are connected to unselected bit lines. The many parallel paths through the unselected MRAM memory cells from the sense line to the unselected bit lines are generally referred to as "sneak paths." Currents that flow through the sneak paths adversely affects the performance of the sense operations. Reducing the length of the sense line reduces the number of MRAM memory cells included in the sneak path, increasing the sneak path resistance. Increased sneak path resistance improves the signal from the sense amplifier and reduces the sensor noise and the net is improved sense amplifier performance.

The common global word lines are shared between two separate, but adjacent arrays of MRAM memory cells. Therefore, only five conductive layers are required per two arrays of MRAM memory cells. An alternate embodiment could include a single global word line for each array of MRAM memory cells. This is a less efficient structure because three conductive layers are required for each array, versus the two and a half conductor layers required for each array according to the invention.

Figure 4:
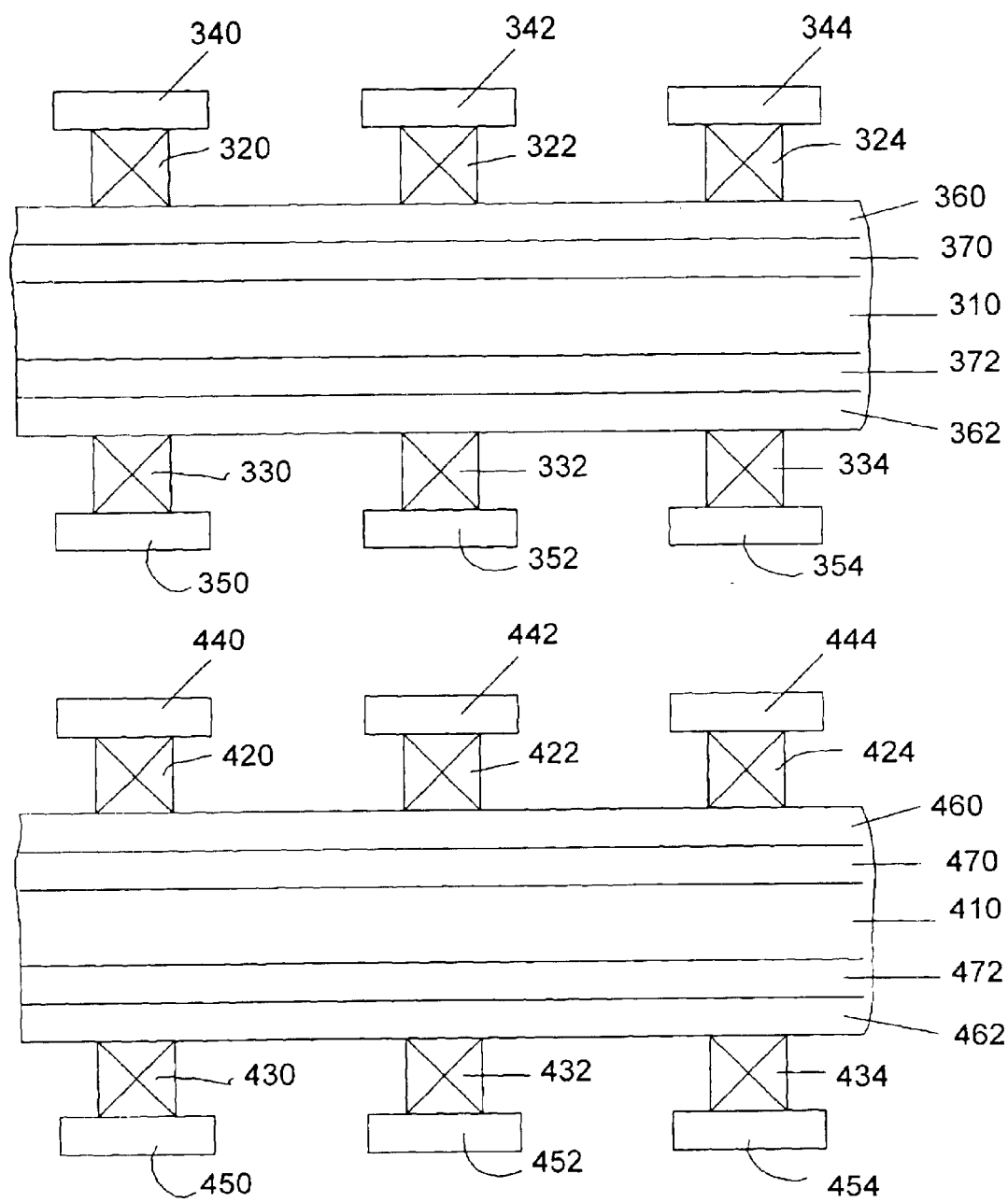
FIG. 4 shows another embodiment of the invention.

FIG. 4 shows another embodiment of the invention. This embodiment includes stacking the embodiment shown in FIG. 3. That is, a first global word line 310 and the associated two arrays of MRAM memory cells (designated 300) are formed over a second global word line 410 an associated two arrays of MRAM memory cells (designated 400). Generally, an insulating material is formed between the first set of MRAM memory cell arrays 300 and the second set of MRAM memory cell arrays 400.

The second global word line 410 is magnetically coupled to MRAM memory cells 420, 422, 424, 430, 432, 434. Bit lines 440, 442, 444, 450, 452, 454 are physically connected to the MRAM memory cells 420, 422, 424, 430, 432, 434. The second global word line 410 along with the bit lines 440, 442, 444, 450, 452, 454 induce magnetic flux fields that set the magnetization and the corresponding logical states of the MRAM memory cells 420, 422, 424, 430, 432, 434.

A logical state is stored in a seventh MRAM memory cell 420 by magnetic fields induced by a seventh bit line 440 and the second global word line 410. A logical state is stored in an eighth MRAM memory cell 422 by magnetic fields induced by an eighth bit line 442 and the second global word line 410. A logical state is stored in a ninth MRAM memory cell 424 by magnetic fields induced by a ninth bit line 444 and the second global word line 410.

A logical state is stored in a tenth MRAM memory cell 430 by magnetic fields induced by a tenth bit line 450 and the second global word line 410. A logical state is stored in an eleventh MRAM memory cell 432 by magnetic fields induced by an eleventh bit line 452 and the second global word line 410. A logical state is stored in a twelfth MRAM memory cell 434 by magnetic fields induced by a twelfth bit line 454 and the second global word line 410.

A third sense line conductor 460 and a fourth sense line conductor 462 are physically connected to the MRAM memory cells 420, 422, 424, 430, 432, 434. The third sense line conductor 460 and the fourth sense line conductor 462 along with the bit lines 440, 442, 444, 450, 452, 454 sense the resistance, and therefore, the logical states of the MRAM memory cells 420, 422, 424, 430, 432, 434.

The resistance, and therefore the logical value, of the seventh MRAM memory cell 420 is determined by sensing the resistance between the seventh bit line 440 and the third sense line conductor 460. The resistance of the eighth MRAM memory cell 422 is determined by sensing the resistance between the eighth bit line 442 and the third sense line conductor 460. The resistance of the ninth MRAM memory cell 424 is determined by sensing the resistance between the ninth bit line 444 and the third sense line conductor 460. The resistance of the tenth MRAM memory cell 430 is determined by sensing the resistance between the tenth bit line 450 and the fourth sense line conductor 462. The resistance of the eleventh MRAM memory cell 432 is determined by sensing the resistance between the eleventh bit line 452 and the fourth sense line conductor 462. The resistance of the twelfth MRAM memory cell 434 is determined by sensing the resistance between the twelfth bit line 454 and the fourth sense line conductor 462.

The MRAM structure of FIG. 4 provides support of four arrays of MRAM memory cells with only ten conductive layers. It is to be understood that the invention does not impose any limitations on the number of layers of MRAM memory cell arrays.

Figure 5:
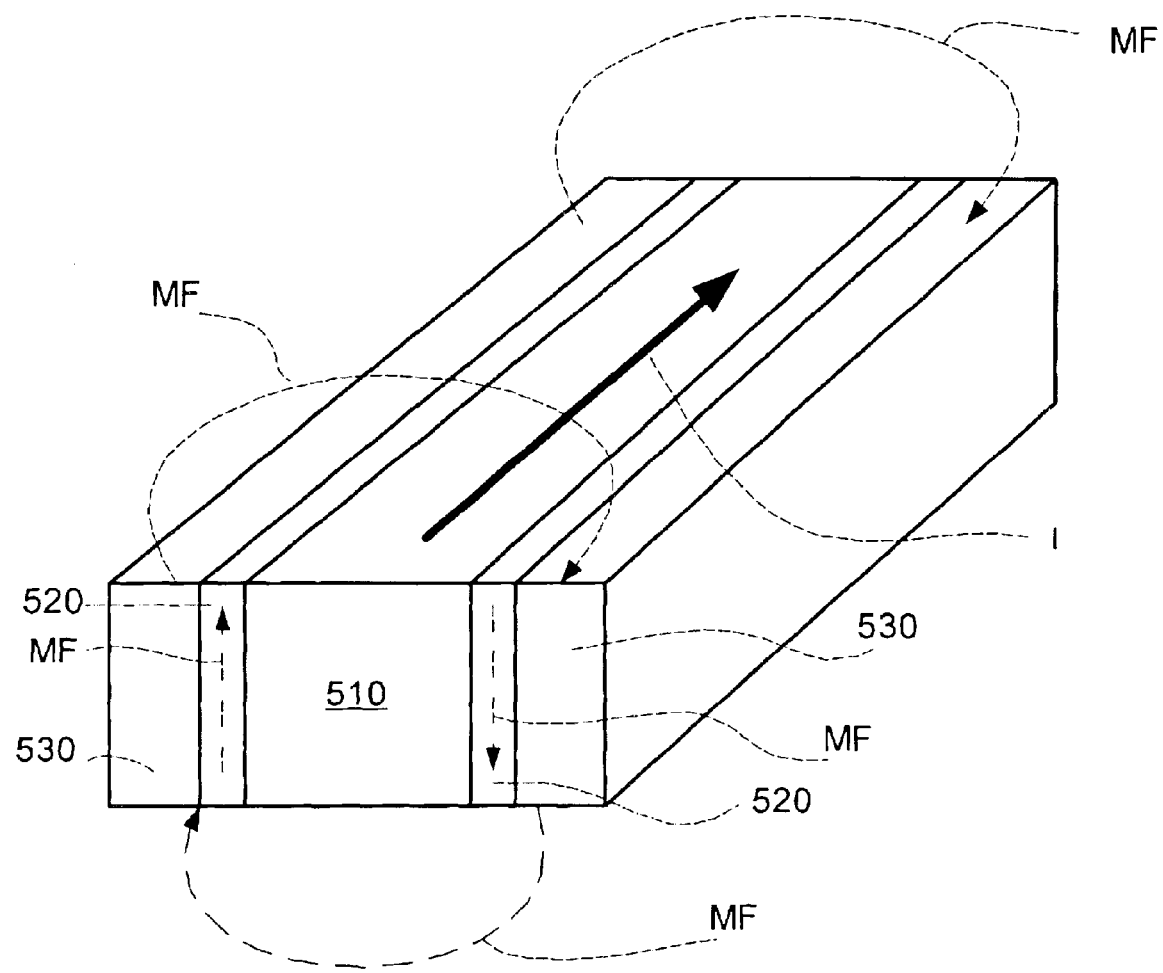
FIG. 5 shows greater detail of an embodiment of a global word line conductor.

FIG. 5 shows greater detail of an end view of embodiment of a global word line. The global word line includes a center conductor 510. The center conductor can be formed from any conductive material such as copper, aluminum or tungsten.

The global word line generally also includes a magnetic liner 520. The magnet liner 520 can be formed from an alloy of magnetic elements, including Nickel, Chromium, Cobalt or Iron. The magnetic liner 510 helps to shape magnetic flux fields MF formed by a current I conducted through the global word line. The magnetic flux fields MF must be created on both sides of the global word line to allow the global word line to operate in conjunction with the previously described bit lines to set the magnetic orientations of the MRAM memory cells. The magnetic flux fields are bi-directional as determined by the direction of the current I. The intensity of the magnetic flux fields is determined by the magnitude of the current I conducted through the global word line. Without the magnetic liner 510, the magnetic flux fields MF would be less concentrated on both sides of the global word line.

As shown in FIG. 5, the magnetic flux fields MF flow through the magnetic liner 520. A Ta liner is generally located on the outside surfaces of the magnetic liner. The Ta liner provides better adhesion between the magnetic liner 510 and an insulator that is located adjacent to the global work line. The magnetic flux fields MF can be reversed in direction by reversing the direction of the current I flowing through the center conductor 510.

In order for the global word line of FIG. 5 to properly write to MRAM memory cells, the MRAM memory cells must be oriented so that the magnetic flux fields MF created by the global word line are coupled to the soft magnetic regions of the MRAM memory cells. The magnetic flux fields MF must be able to set the orientation of the magnetization of the soft magnetic regions.

FIGS. 6–11 show processing steps that can be used to form an embodiment of the global word line conductor.

Figure 6:
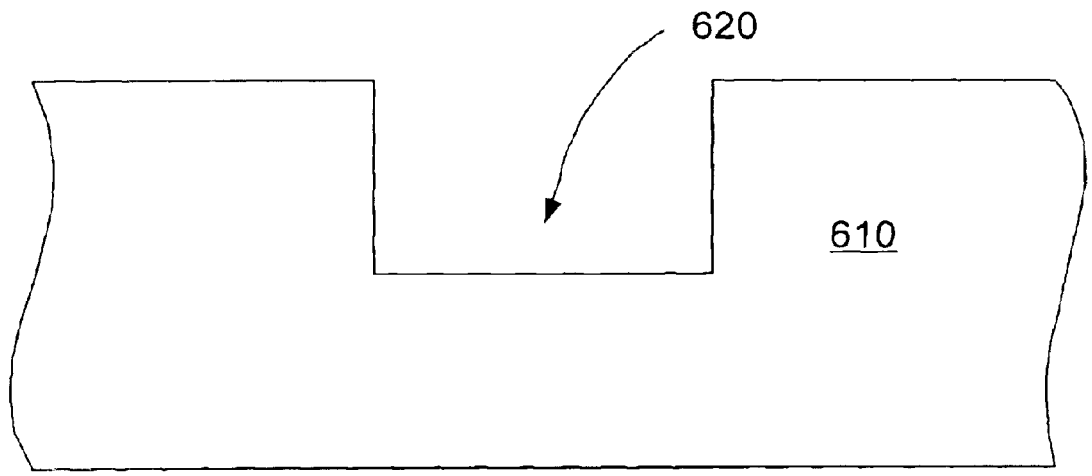
FIG. 6 shows a trench etched in a substrate.

FIG. 6 shows a trench 620 etched in a substrate 610. This generally includes etching a trench in an oxide substrate 610. More particularly, this can include reactive ion etching of an $SiO_2$ insulator with Fluorine or Chlorine containing plasma.

Figure 7:
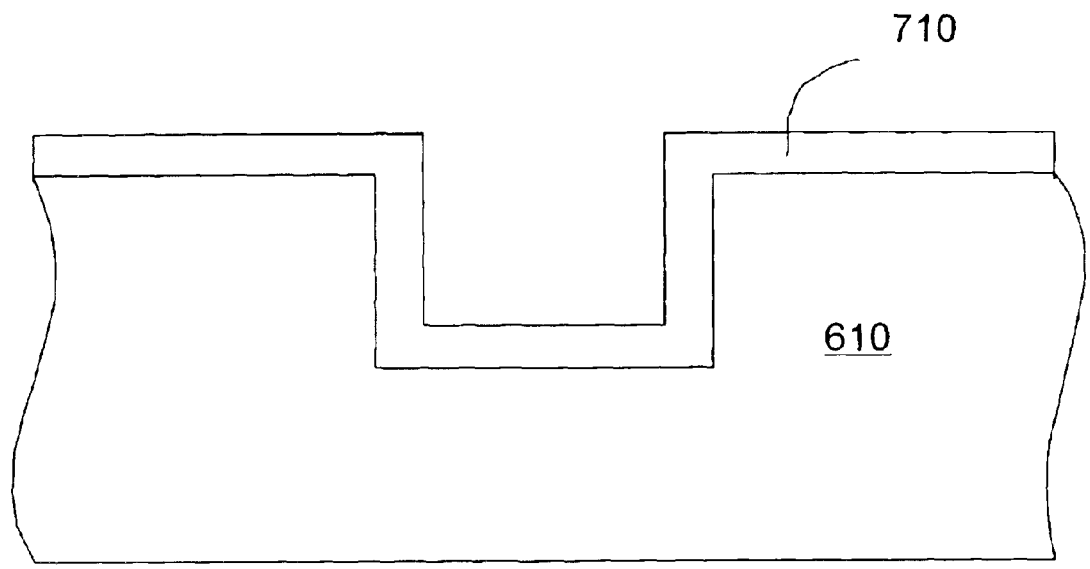
FIG. 7 shows a first liner material deposited over the trench and the substrate.

FIG. 7 shows a first liner material 710 deposited over the trench 620 and the substrate 610. The first liner material can be Ta. The first liner material 710 is generally deposited through CVD (chemical vapor deposition). This also can be described as conformal deposition of a "glue layer" by CVD.

Figure 8:
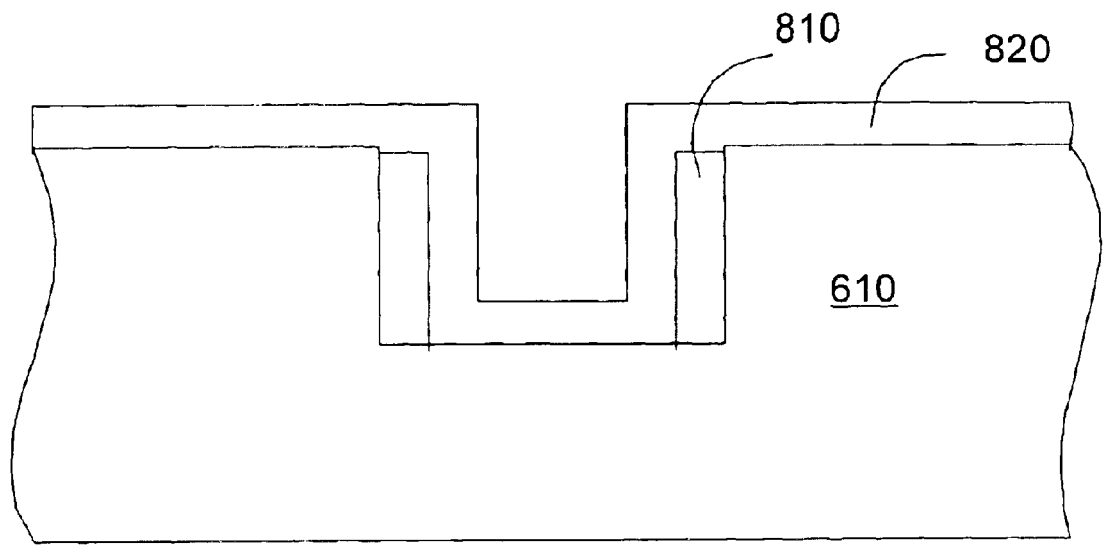
FIG. 8 shows the first liner having been etched, and magnetic layer deposited over the first liner and the substrate.

FIG. 8 shows the first liner material having been etched, and a magnetic layer 820 deposited over a first liner 810 and the substrate 610. The first liner material 710 is generally anisotropically etched leaving the first liner 810 on only the edges of the trench. Then the magnetic layer can be conformally deposited by CVD or sputtering.

Figure 9:
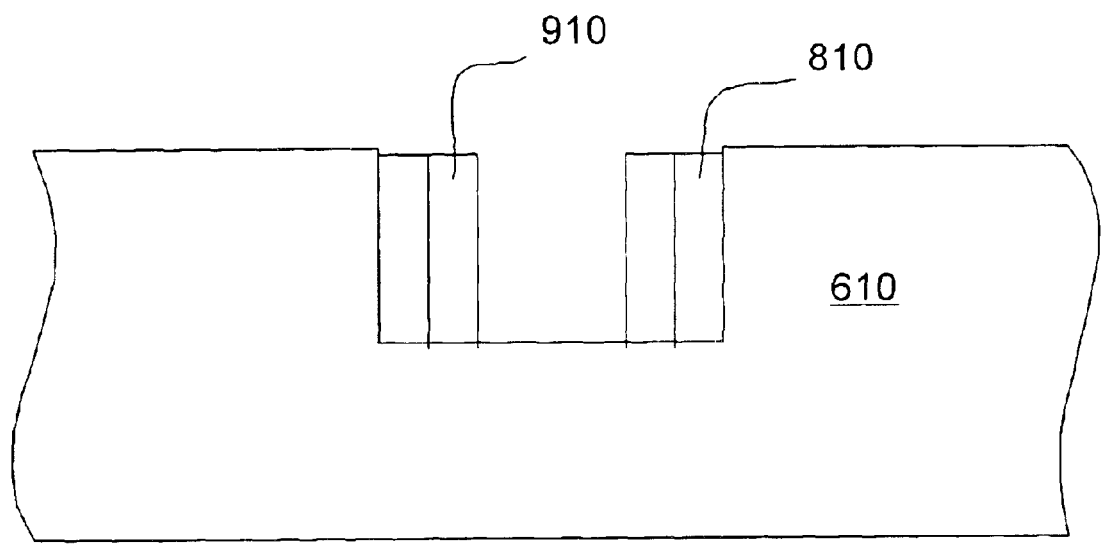
FIG. 9 shows the magnetic layer having been etched.

FIG. 9 shows the magnetic layer 820 having been etched leaving a magnetic layer liner 910. This can include anisotropic removal of the magnetic liner with reactive ion etching or sputtering etching (ion milling).

Figure 10:
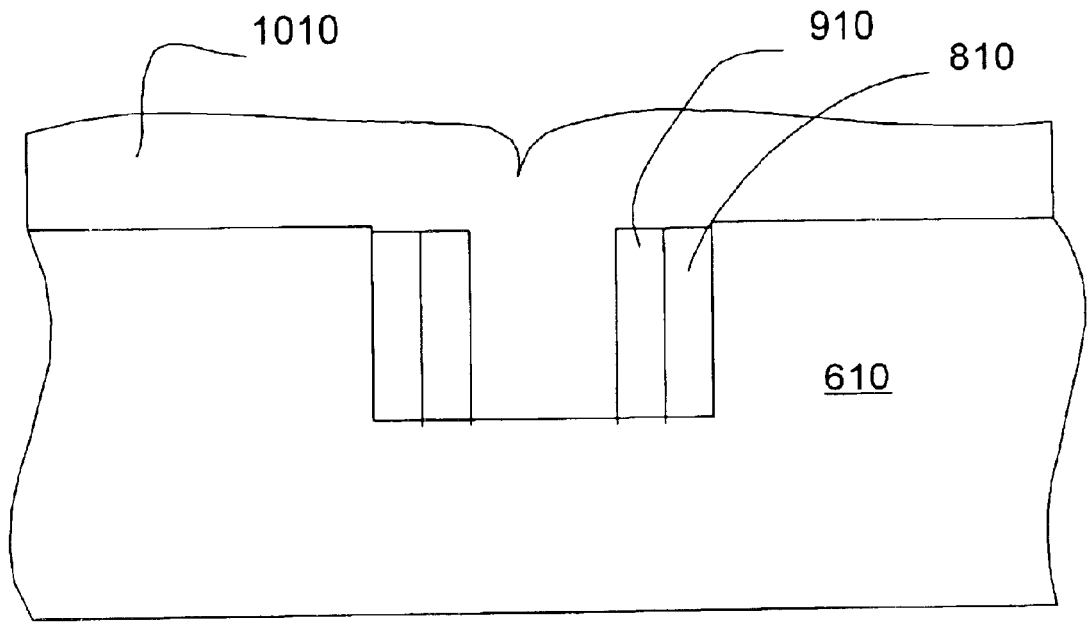
FIG. 10 shows a conductive layer having been deposited over the magnetic layer and the substrate.

FIG. 10 shows a conductive layer 4010 having been deposited over the magnetic layer liner 910 and the substrate 610. For a Copper conductive layer, this can include sputtering or CVD deposition of a Copper seed layer followed by electroplating. For other types of metal layers such as Aluminum, this can include direct CVD deposition to fill the trench.

Figure 11:
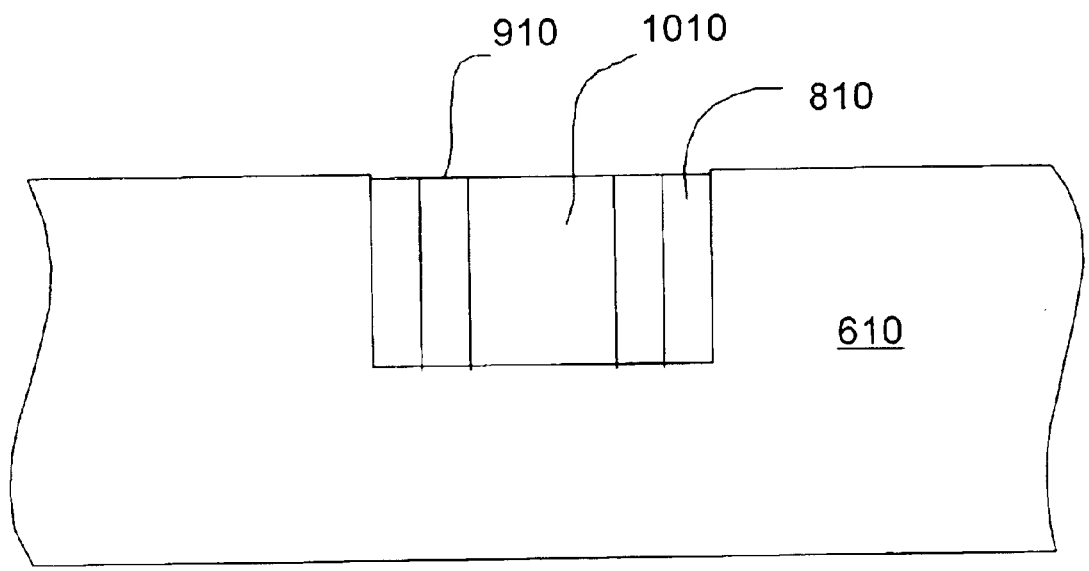
FIG. 11 shows the conductive layer having been etched, forming a conductive global word line structure.

FIG. 11 shows the conductive layer 1010 having been planarized, forming a conductive global word line structure having a center conductor 1110. Planarization of the overhanging metal of the conductive layer can be accomplished through chemical, mechanical polishing (CMP).

Although specific embodiments of the invention have been described and illustrated, the invention is not to be limited to the specific forms or arrangements of parts so described and illustrated. The invention is limited only by the appended claims.

What is claimed is:

1. A method of forming a shared global word line MRAM structure, comprising:
   etching a trench in an oxide layer formed over a substrate;
   depositing an first liner material;
   anisotropically etching the deposited first liner material leaving the first liner material on edges of the trench, and physically contacting a bottom of the trench;
   depositing an magnetic metal liner material;
   anisotropically etching the deposited magnetic metal liner material leaving the magnetic metal liner material over the first liner material on edges of the trench, so that the magnetic metal liner extends to and physically contacts the bottom of the trench;
   depositing a conductive layer; and
   chemically, mechanically polishing the conductive layer.

2. The method of forming a shared global word line MRAM structure of claim 1, wherein the first liner material comprises tantalum.

3. The method of forming a shared global word line MRAM structure of claim 1, wherein the magnetic metal liner material comprises at least one of Nickel, Chromium, Cobalt and Iron.

4. The method of forming a shared global word line MRAM structure of claim 1, wherein the conductive layer comprises Copper.

5. The method of forming a shared global word line MRAM structure of claim 1, wherein the conductive layer is deposited through chemical vapor deposition.

6. The method of forming a shared global word line MRAM structure of claim 1, wherein the substrate comprises a first MRAM array.

7. The method of forming a shared global word line MRAM structure of claim 6, further comprising forming a second MRAM array over the shared global word line.

* * * * *